US011367010B2

(12) United States Patent
Ducore et al.

(10) Patent No.: US 11,367,010 B2
(45) Date of Patent: Jun. 21, 2022

(54) QUANTUM COMPUTER SIMULATOR CHARACTERIZATION

(71) Applicant: IonQ, Inc., College Park, MD (US)

(72) Inventors: Andrew Maps Ducore, Bethesda, MD (US); Yunseong Nam, North Bethesda, MD (US); Omar Shehab, Landover Hills, MD (US); Matthew Joseph Keesan, Washington, DC (US); Stewart O. Allen, Reston, VA (US)

(73) Assignee: IONQ, INC., College Park, MD (US)

( * ) Notice: Subject to any disclaimer, the term of this patent is extended or adjusted under 35 U.S.C. 154(b) by 703 days.

(21) Appl. No.: 16/401,585

(22) Filed: May 2, 2019

(65) Prior Publication Data

US 2019/0340532 A1 Nov. 7, 2019

Related U.S. Application Data (60) Provisional application No. 62/665,734, filed on May 2, 2018.

(51) Int. Cl.
*G06N 10/00* (2022.01)
*G06F 8/41* (2018.01)
*G06F 30/20* (2020.01)

(52) U.S. Cl.
CPC ............. *G06N 10/00* (2019.01); *G06F 8/443* (2013.01); *G06F 30/20* (2020.01)

(58) Field of Classification Search
CPC ........ G06N 10/00; G06N 5/003; G06F 8/443; G06F 30/20; G06F 30/25; G06F 30/27; G06F 30/28; G06F 2111/00; G06F 2119/22
See application file for complete search history.

(56) References Cited

U.S. PATENT DOCUMENTS

| 2016/0232034 | A1* | 8/2016 | Blanchflower | ......... G06F 9/505 |
| 2017/0193138 | A1* | 7/2017 | Katsuki | ................... G06F 17/10 |
| 2017/0270424 | A1* | 9/2017 | Sankaralingam | ....... G06F 8/443 |
| 2017/0330101 | A1* | 11/2017 | Hastings | ............... G06N 99/007 |

FOREIGN PATENT DOCUMENTS

WO   WO-2017096244 A1 * 6/2017 .............. G06F 11/00

* cited by examiner

*Primary Examiner* — Stacy Whitmore
(74) *Attorney, Agent, or Firm* — ArentFox Schiff LLP (57) ABSTRACT

The disclosure describes various aspects of quantum computer simulators. In an aspect, a method for characterizing a quantum computer simulator includes identifying simulator processes supported by the quantum computer simulator, generating, for each simulator process, characteristic curves for different gates or quantum operations, the characteristic curves including information for predicting the time it takes to simulate each of the gates or quantum operations in a respective simulator process, and providing the characteristic curves to select one of the simulator processes to simulate a circuit, quantum program, or quantum algorithm that uses at least some of the gates or quantum operations. In another aspect, a method for optimizing simulations in a quantum computer simulator is described where a simulator process is selected for simulation of a circuit, quantum program, or quantum algorithm based on characteristic curves that predict a time it takes for the simulation to be carried out.

30 Claims, 9 Drawing Sheets

QUANTUM COMPUTER SIMULATOR CHARACTERIZATION

CROSS REFERENCE TO RELATED APPLICATION

The present application claims priority to and the benefit from U.S. Provisional Patent Application No. 62/665,734, entitled "QUANTUM COMPUTER SIMULATOR CHARACTERIZATION," and filed on May 2, 2018, the contents of which are incorporated herein by reference in their entirety.

BACKGROUND OF THE DISCLOSURE

Aspects of the present disclosure generally relate to quantum computing systems, and more specifically, to the operations of quantum computer simulators and the characterization of such simulators.

Trapped atomic ions and superconducting circuits are two examples of quantum information processing (QIP) approaches that have delivered universal and fully programmable machines.

For quantum systems, there is sometimes the need to simulate or estimate their performance with respect to certain operations or functions. For commercial purposes, this insight can enable a provider of quantum computing services the ability to offer a potential user of these services a guideline as to the capabilities of the system, as well as the opportunity to test and debug quantum code without incurring the cost or complexity of execution on an actual quantum computing system. As such, for different quantum systems there can be specific quantum simulators that permit the study, analysis, or characterization of the quantum systems. The quantum simulators can be special purpose devices or systems specifically designed to provide insight about the operational capabilities of particular quantum systems.

One of the issues that can arise is inconsistency or unpredictability in quantum simulators. For example, different quantum simulators can run different quantum programs, quantum algorithms or circuits at different speeds, which can cost unpredictable amounts of money, and to users unpredictable amounts of time. The best solutions currently found in the market are benchmarking simulators that run circuits representing known quantum algorithms, using different numbers of system qubits, and create an overall benchmark. These solutions, however, work irrespective of circuit inputs. This is disadvantageous because, in addition to the number of system qubits, simulation time is at least partially a function of gate type distribution and controls which are not taken into account by current solutions.

Techniques that allow for more effective and efficient simulation of quantum systems are therefore desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

The present disclosure provides a solutions to the problems outlined above in which a characterization of gates or quantum operations is produced by measuring the speed of simulations of circuits with 1, n system qubits across a variety of simulator processes or models and a variety of gate configurations or quantum operations, and then choosing the optimal simulator environment based on the input circuit, quantum program, or quantum algorithm (e.g., based on the particular quantum operations or gates used by the input circuit, quantum algorithm, or quantum program).

The proposed solution includes the selection of a subset of the gate space to test for each simulator upon startup time. The process iteratively applies gates on systems of 1, n system qubits until an increasing exponential growth in simulation time is identified to determine the absolute number of supported system qubits, and looks for constant exponential growth in simulation time to determine the extent that the simulation time is affected by parallelization. Overall gate or quantum operation performance can be extrapolated based on the tested subset.

In an aspect of the disclosure, a method for characterizing a quantum computer simulator is described. The method can include identifying multiple simulator processes supported by the quantum computer simulator, generating, for each simulator process, characteristic curves for each multiple gates or quantum operations, the characteristic curves including information for predicting a time it takes to simulate each of the multiple gates or quantum operations in a respective simulator process, and providing the characteristic curves for selection of one of the multiple simulator processes to simulate a circuit, quantum program, or quantum algorithm that uses at least some of the multiple gates or quantum operations.

In an aspect of the disclosure, a method for optimizing simulations in a quantum computer simulator is described. The method can include receiving a circuit, quantum program, or quantum algorithm for simulation by the quantum computer simulator, selecting for simulation of the circuit, quantum program, or quantum algorithm, a simulator process from multiple simulator processes supported by the quantum computer simulator, the selection being based at least in part on characteristic curves that predict the time it takes to simulate gates or quantum operations in the circuit, quantum program, or quantum algorithm in each of the multiple simulator processes, and providing an estimate of the time it will take to simulate the circuit, quantum program, or quantum algorithm by the simulator process.

Described herein are methods, apparatuses, and computer-readable storage medium for various aspects associated with quantum simulators and characterization of such.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein can be practiced. The detailed description includes specific details for the purpose of providing a thorough understanding of various concepts. However, it will be apparent to those skilled in the art that these concepts can be practiced without these specific details. In some instances, well known components are shown in block diagram form in order to avoid obscuring such concepts.

A few definitions are provided by way of illustration of the scope of some of the terms used in this disclosure. For example, a quantum circuit (also referred to as a "circuit") may refer to a partially ordered sequence of quantum logic gates or quantum operations which, when executed on a quantum computer or simulated on a quantum computer simulator, performs some calculation. Circuits are generally written in a domain specific assembly language targeting a specific quantum instruction set architecture.

A quantum algorithm may refer to a description of a process which constructs a quantum circuit.

A quantum program may refer to a quantum algorithm written in a high level, domain specific quantum programming language.

A quantum logic gate (also referred to as a "gate") may refer to a primary component that quantum circuits are constructed from. An individual gate within a circuit consists of a type (e.g. an X gate, a Y gate), one or more target qubits, and zero or more control qubits.

A quantum operation may refer to basic components which quantum circuits are constructed from. Quantum Logic Gates are an example of quantum operations, but quantum operations also include operations not generally referred to as gates such as the measurement of a qubit, the initialization of a qubit, and other operations capable of being performed by a quantum computer or capable of being simulated by a quantum computer simulator.

A quantum computer simulator (also referred simply as a "simulator") is a program executing on a classical (e.g., non-quantum) computer that models the behavior of a quantum computer and allows for the simulated execution of a circuit.

System qubits may refer to the total number of qubits used in a circuit.

Target and Control qubits may refer to different qubits, however, while technically this distinction is not significant in quantum systems, within the scope of quantum computer simulators and gate representations target qubits are qubits that a gate is said to operate on, and control qubits are qubits whose state determine whether the gate has an effect.

Heuristics as used herein may refer to one or more rules to be applied to data to assist in drawing inferences from the data.

A process may refer to an instance of a computer program that is being executed (e.g., on a particular processor or hardware). A process may include the program code and its current activity. Depending on the operating system (OS), firmware, and/or software managing the operation of the process, the process may be made up of multiple threads of execution that execute instructions concurrently. A simulator process as used herein may refer to one of multiple different processes supported by a quantum computer simulator for modeling the behavior of a quantum computer, where each simulator process can be characterized or benchmarked for comparing its performance to that of other simulator processes.

Quantum computer simulators are generally characterized to provide some form of benchmarking to determine performance characteristics of the simulators. Typically what is done is that a known circuit, quantum program, or quantum algorithm is simulated on a particular quantum computer simulator to determine how quickly the quantum computer simulator can simulate that circuit, quantum program, or quantum algorithm. The faster the performance of the simulator the faster a user can see the results of simulating the circuit, quantum program, or quantum algorithm. In addition, quantum computer simulators can be used to, for example, provide a way to confirm part or all of a computational result that is also performed by an actual quantum computer.

These known circuits, quantum programs, or quantum algorithms can be simulated on multiple quantum computer simulators to benchmark the simulators against each other.

These techniques, however, can provide limited insight. Sometimes, it is not enough to know how fast a particular circuit, quantum program, or quantum algorithm runs on any one quantum computer simulator, but it can be important or of interest to predict how long it will take for an arbitrary circuit, quantum program, or quantum algorithm to be simulated in a particular simulator. In order to figure this out it is therefore important to know how long it will take for a particular quantum computer simulator to simulate each gate or quantum operation in the circuit, quantum program, or quantum algorithm.

Figure 1:
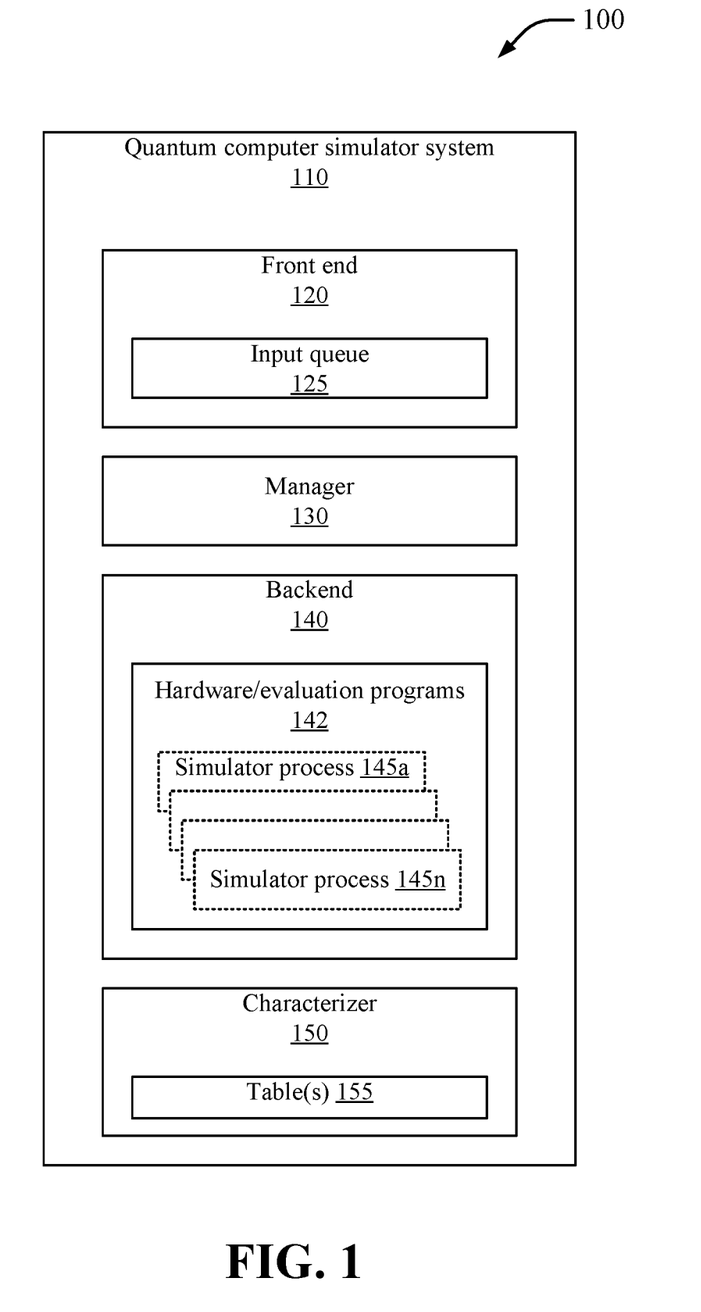
FIG. 1 is a diagram that illustrates an example of a quantum computer simulator in accordance with aspects of this disclosure.

FIG. 1 shows a diagram 100 that illustrates an example of a quantum computer simulator system 110 in accordance with aspects of this disclosure. In this example, the quantum computer simulator system 110 can include a front end 120 with an input queue 125, a manager 130, a backend 140 having hardware and evaluation programs 142 on which one or more simulator processes 145a, . . . , 145n can be run or executed, and a characterizer 150 that benchmarks the various, different simulators processes supported by the quantum computer simulator system 110 as described in more detail below. The quantum computer simulator system 110 can receive a job (i.e., an input circuit, quantum program, or quantum algorithm) through the front end 120 and place the job in the queue 125. The manager 130 can analyze the contents of the queue 125 and decide or select which of the simulator processes 145 (e.g., which one of simulator processes 145a, . . . , 145n) to use for the simulation of the job in the queue 125. This selection can be based on information (e.g., characteristic curves) generated by the characterizer 150 and contained in, for example, table(s) 155. Once the simulation is completed, the results can be provided to the user that submitted the job. Each of the simulator processes 145 can be associated with a particular evaluation or characterization program running on hardware with a particular hardware configuration (e.g., memory, processing, acceleration configuration). In some implementations, different hardware configurations can use different compiled versions or formats of the programs that perform the simulation, evaluation, or characterization functions supported by the quantum computer simulator system 110. Additional details regarding various non-limiting examples of combinations of hardware and evaluation programs (e.g., a hardware/software evaluations matrix) are described below in connection with FIGS. 2A-2D.

The quantum computer simulator system 110, through the manager 130, for example, can provide the user with an estimate of how long it will take to simulate the job before the user agrees to or instructs for the simulation to take place. The user can therefore have the opportunity to determine whether any cost associated with the use of the quantum computer is justified by, for example, comparing the expected time it takes the quantum computer to perform a particular computation to an expected time it takes more conventional resources to perform the same computation. To do this, the quantum computer simulator system 110 can analyze the various gates or quantum operations in the circuit, quantum program, or quantum algorithm and can predict how long it will take to simulate each of these gates or quantum operations in each of the simulator processes 145a, . . . , 145n based on information generated by the characterizer 150. The simulator process for which the overall predicted time is less and/or is predicted to perform the simulation most efficiently (e.g., power or resources used), is selected and its respective predicted simulation time is provided to the user to make a determination as to whether to perform the simulation given the amount of time it is likely to take.

The characterizer 150 is configured to build a profile of all the different gates or quantum operations that can be performed by the quantum computer simulator system 110, and predict (or generate information from which it can be predicted) how long each of these gates or quantum operations will take to be simulated by the quantum computer simulator system 110. Moreover, these predictions can be generated for each different gate or quantum operation in each of the different simulator processes 145 supported by the quantum computer simulator system 110.

One way in which the characterizer 150 generates or builds these profiles is by building a simple circuit that includes a particular gate or quantum operation in a particular simulator process 145 many times. For example, a circuit can repeat the same gate or quantum operation approximately 400 or 500 times. The total time of the simulation is then divided by the number of repetitions to get an approximate time that it takes for that gate or quantum operation to simulate in the respective simulator process 145.

However, to do this for every single gate or quantum operation could take a long time (e.g., in the order of months or even years), particularly if hundreds of repetitions are needed for each single gate or quantum operation in order to obtain an accurate measurement of the time it takes to simulate that gate or quantum operation. As such, the characterizer 150 is configured to make some determinations and assumptions (e.g., based on heuristics) that allow the characterizer 150 to know when the amount of testing or measurements is sufficient without needing to be exhaustive.

One of the aspects that is taken into consideration in generating these profiles is the fact that the different gates or quantum operations have a set of properties that influence how quickly they can run on the quantum computer simulator system 110. One such property is the type of the gate. For example, quantum computers use different types of gates, such as X gates, Y gates, RX gates, to name a few. Each of these gates, for example, would have a different performance profile or characteristic.

In addition to which gate is to be simulated, another aspect is the issue of how many system qubits there are overall in the circuit, quantum program, or quantum algorithm being considered for the simulation, that is, on how many system qubits there are in the circuit containing a particular gate or quantum operation to be run or simulated. For example, an X gate on one qubit in a circuit that has 10 qubits (i.e., 10 system qubits) will take a different amount of time to simulate than an equivalent gate or quantum operation in a circuit that has 15 or 20 system qubits.

Once the circuits get large enough, each qubit that is added will more or less double the amount of time it takes to simulate a single gate or quantum operation because there are now twice as many states on which the calculations need to be performed for the simulation.

As such, the characterizer 150 can try the same gate (or other quantum operation) on ever larger circuits. For example, the characterizer 150 will try an X gate on a 1 system qubit circuit, then on a 2 system qubit circuit, and so on (i.e., from 1, . . . , n, where n is the maximum number of system qubits supported by the quantum computer simulator system 110). That is, the characterizer 150 will continue to add system qubits and measure the amount of time it takes for each of these configurations. When the characterizer 150 identifies a trend, for example, the characterizer 150 identifies or determines that each successive simulation takes approximately twice as much time as the last simulation (i.e., each additional system qubit is twice as expensive to simulate), the characterizer 150 can make the assumption that from that point on the growth is exponential (and accurately predictable). Therefore, the characterizer 150, rather than continuously increasing the number of system qubits until it reaches the maximum number of system qubits that the quantum computer simulator system 110 can support, it cuts off the testing or measuring as soon as it notices, identifies, or determines that the growth going forward is exponential, saving a lot of measuring time Another aspect to consider when generating the profiles for the various configurations of the gates or quantum operations and for the different simulator processes 145a, . . . , 145n, is that many of the gates can be controlled gates (i.e., use control qubits). There can be an inverse relationship between the number of control qubits and the time it takes to simulate a particular gate. That is, the more control qubits that are added to a gate, the faster or quicker its simulation runs. One reason for the faster simulation being that for each control qubit that is added, there are half as many states to consider when the simulation is performed. For example, an X gate with 10 control qubits on a 20 qubit system should have roughly similar performance to the performance of an X gate with no control qubits (i.e., 0 control qubits) on a 10 qubit system.

In general, the characterizer 150 can be used to obtain the performance characteristics of both controlled and uncontrolled gates. This, however, is a very large space to search. For example, in a system that supports up to 30 qubits, for each of those sizes the characterizer 150 would need to test or measure the speed of controlled gates from 0 control qubits to the maximum number of allowed control qubits (determined by the number of system qubits being considered and the number of target qubits for the given gate, i.e. N−M control qubits where N is the number of system qubits and M is the number of target qubits for the gate being considered). So instead of searching the entire space, the characterizer 150 can be configured to search a subset of that space and interpolate between the points and extrapolate beyond points. Again, the characterizer 150 can identify trends and use those as heuristics to determine when the profiling is sufficiently complete and predictable such that no additional time for testing or measuring is needed.

In the case of control qubits, as described above, there is an expected relationship where, for example, a 10 control qubit gate on a system with 20 system qubits behaves like a 0 control qubit gate on a system with 10 system qubits. This relationship, however, does not hold in all circumstances and to obtain accurate measurements it is not sufficient to simply assume that it is possible to just subtract the number of control qubits from the number of system qubits to obtain the characterization from that of an uncontrolled gate in a smaller circuit. This relationship tends not to apply as well to smaller numbers of control qubits, but as the number of control qubits increases, the performance of two gates or operations as described above becomes close to the same (e.g., a ratio of their performances is close to 1). That is, as the number of control qubits becomes larger, using this relationship becomes a better estimate. As such, the characterizer 150 can also identify or detect this trend and once this relationship is found to be a very good estimate (e.g., within a threshold value), then the characterizer 150 need not test for even larger number of control qubits since the relationship will continue to hold as the number of control qubits is increased. This relationship also tends not to apply equally to all simulator processes, some of which have the property that controlled operations are still faster than uncontrolled operations but slower than what would be expected by assuming that the number of control qubits can be subtracted from the number of system qubits to obtain the characterization from uncontrolled gates on smaller circuits (i.e. circuits with fewer system qubits). For simulator processes where this relationship does not apply, the relationship between the number of control qubits and the number of system qubits which produce similar performance on uncontrolled gates can be taken over a subset of supported configurations and interpolated or extrapolated to produce estimates of this performance relationship for untested configurations.

As described above, the characterizer 150 can make use of heuristics (e.g., rules or decision points) to address the costs and time associated with profiling, characterizing, or benchmarking a range of simulator processes for all different configurations of quantum operations that can be found in a circuit, quantum program, or quantum algorithm to be simulated. Also, when scaling the capabilities of the quantum computer simulator system 110 by adding one or more simulator processes 145 (which may also be referred to as simulation nodes, worker nodes) to the backend 140, the characterizer 150 can be used to also determine the performance characteristics of the added simulator processes such that the quantum computer simulator system 110 (e.g., the manager 130) can determine which resource is most efficient for simulating a circuit, quantum program, or quantum algorithm and/or how quickly that circuit, quantum program, or quantum algorithm can be simulated by such a resource. That is, with the addition and characterization of one or more simulator processes 145, the quantum computer simulator system 110 now has more options to identify which simulator process is most efficient in a particular situation.

In some implementations, each simulator process 145 includes or is associated with an evaluation program running on separate hardware (see e.g., FIGS. 2A-2D), the separate hardware being one or more of a graphic processing unit (GPU), a single-core central processing unit (CPU), a multi-core CPU, a tensor processing unit, an application specific integrated circuit (ASIC), or a field programmable gate array (FPGA)-based Ising model simulator. Some acceleration features supported by the various hardware can be leveraged by the evaluation programs to increase the performance of the simulator process.

When having a simulator process that is GPU-based (e.g., based on using a GPU as hardware for the evaluation program) and another simulator process that is CPU-based (e.g., based on using a single core or multi-core CPU as hardware for the evaluation program), the quantum computer simulator system 110 can determine to simulate a received circuit, quantum program, or quantum algorithm using the GPU-based simulator process because it is faster, using the CPU-based simulator process because the circuit, quantum program, or quantum algorithm cannot be run on the GPU-based simulator process, or using the CPU-based simulator process even though it can be run in the GPU-based simulator process but it is cheaper or more efficient to use the CPU-based simulator process. In other words, the selection of the simulator process can take into account the time it takes for the simulation to be carried out, the ability of a particular simulator process to carry out the simulation, and/or the cost associated with carrying out the simulation.

As described in the various examples above, the quantum computer simulator system 110, through the characterizer 150 and/or the manager 130, tries to optimize the resources available in the backend 140 to reduce the costs (e.g., costs to operate the resources, time, acquisition costs of the resources) of the simulation. To accomplish this, the quantum computer simulator system 110 should be able to dynamically select or use the backend resource that produces optimized operation to run any circuit, quantum program, or quantum algorithm that is provided to the quantum computer simulator system 110, and uses the profile information or characterization generated through the techniques described herein, including heuristics, because it is nearly impossible to do so by exhaustive or naïve measurements given the large number of factors and possible simulator processes to consider.

FIGS. 2A-2D show diagrams 200, 220, 240, and 260 that illustrate different simulator processes that may be available to a quantum computer simulator in accordance with aspects of this disclosure. As described above, the quantum computer simulator system 110 may have multiple simulator processes 145 from which to select one or more to perform a particular simulation. Each of these simulator processes 145 can be characterized or benchmarked so that it is possible to estimate its performance for a particular simulation (e.g., one or more gates or quantum operations). Moreover, each simulator process 145 can have an evaluation program (EP) that is run on hardware to perform the respective simulation.

Figure 2A:
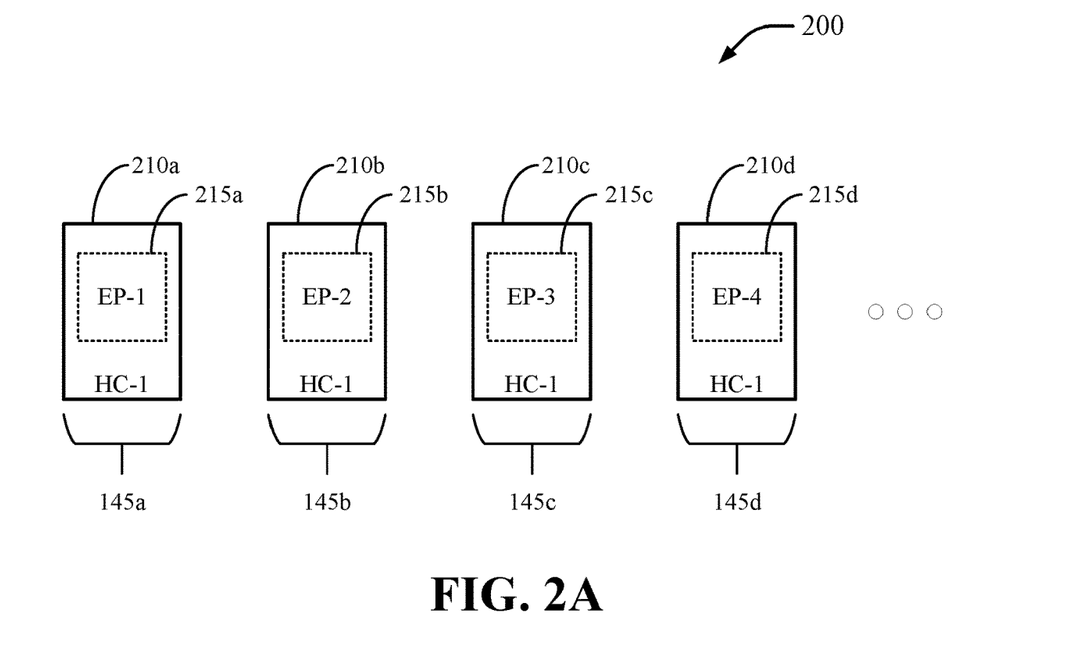
FIGS. 2A-2D are diagrams that illustrate different simulator processes that may be available to a quantum computer simulator in accordance with aspects of this disclosure.

The diagram 200 in FIG. 2A shows an example of multiple simulator processes 145a, 145b, 145c, 145d, . . . , that are available to and supported by a quantum computer simulator system (e.g., quantum computer simulator system 110). In this example, a group or set of simulator processes 145 can include the simulator process 145a associated with a first evaluation program 215a (EP-1) running or executing on hardware 210a having a first hardware configuration (HC-1), the simulator process 145b associated with a second evaluation program 215b (EP-2) running or executing on hardware 210b having the first hardware configuration (HC- 1), the simulator process 145c associated with a third evaluation program 215c (EP-3) running or executing on hardware 210c having the first hardware configuration (HC-1), and the simulator process 145d associated with a fourth evaluation program 215d (EP-4) running or executing on hardware 210d having the first hardware configuration (HC-1). The evaluation programs may differ in characterization functionality or features, while a hardware configuration may refer to the system resource settings (e.g., processing capabilities, processing cores (e.g., GPU, single core CPU, multi-core CPU, Tensor processor, etc.), memory size, memory configuration) allotted for a specific, separate piece of hardware. Each of these simulator processes can be benchmarked or characterized for different gates and/or quantum operations as described herein, where such benchmarking or characterization can be used to identify or select a simulator process for a particular task. The example in FIG. 2A is provided by way of illustration and more or fewer simulator processes than those shown can be supported by the quantum computer simulator system.

Figure 2B:
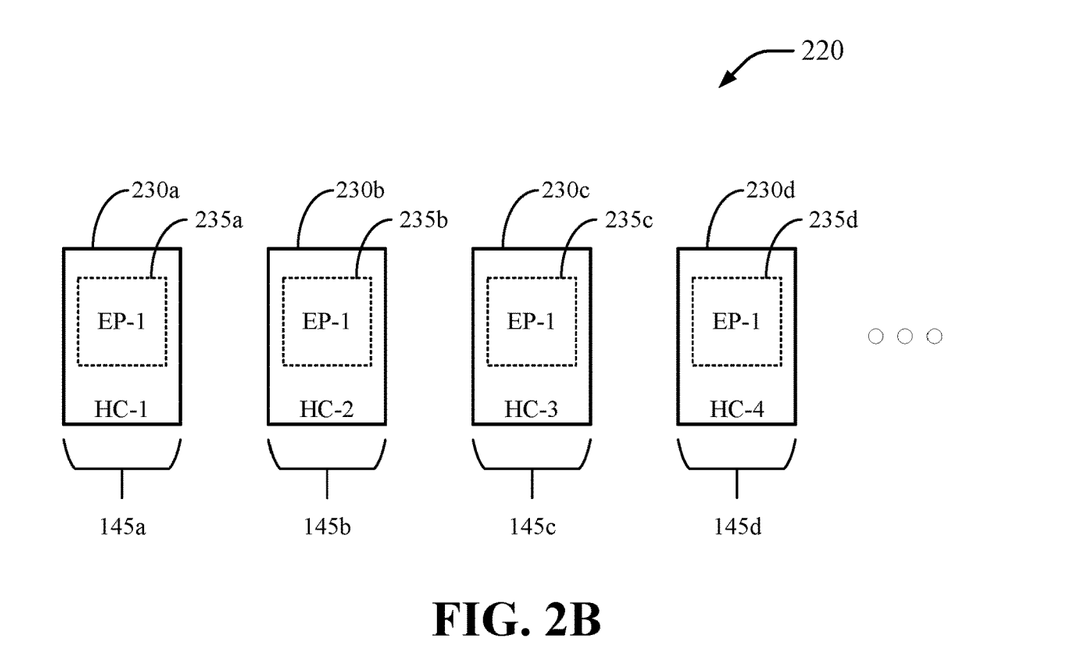

The diagram 220 in FIG. 2B shows another example of multiple simulator processes 145a, 145b, 145c, 145d, . . . , that are available to and supported by a quantum computer simulator system (e.g., quantum computer simulator system 110). In this example, a group or set of simulator processes 145 can include the simulator process 145a associated with a first evaluation program 235a (EP-1) running or executing on hardware 230a having a first hardware configuration (HC-1), the simulator process 145b associated with the first evaluation program 235b (EP-1) running or executing on hardware 230b having a second hardware configuration (HC-2), the simulator process 145c associated with the first evaluation program 235c (EP-1) running or executing on hardware 230c having a third hardware configuration (HC-3), and the simulator process 145d associated with the first evaluation program 235d (EP-1) running or executing on hardware 230d having a fourth hardware configuration (HC-4). The evaluation programs have the same characterization functionality or features (but may be compiled differently), while the different hardware configurations may refer to differences in the system resource settings (e.g., GPU, single core CPU, multi-core CPU, Tensor processor, etc.), memory size, memory configuration) allotted for a specific, separate piece of hardware. Each of these simulator processes can be benchmarked or characterized for different gates and/or quantum operations as described herein, where such benchmarking or characterization can be used to identify or select a simulator process for a particular task. The example in FIG. 2B is provided by way of illustration and more or fewer simulator processes than those shown can be supported by the quantum computer simulator system.

Figure 2C:
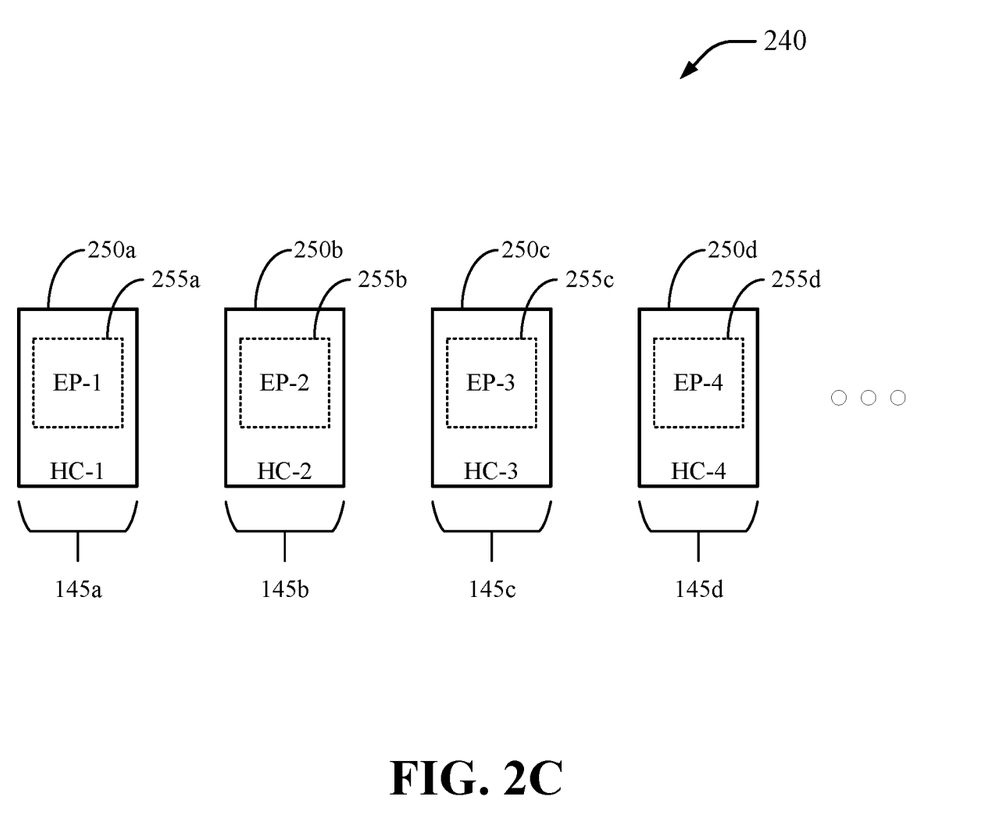

The diagram 240 in FIG. 2C shows yet another example of multiple simulator processes 145a, 145b, 145c, 145d, . . . , that are available to and supported by a quantum computer simulator system (e.g., quantum computer simulator system 110). In this example, a group or set of simulator processes 145 can include the simulator process 145a associated with a first evaluation program 255a (EP-1) running or executing on hardware 250a having a first hardware configuration (HC-1), the simulator process 145b associated with a second evaluation program 255b (EP-2) running or executing on hardware 250b having a second hardware configuration (HC-2), the simulator process 145c associated with a third evaluation program 255c (EP-3) running or executing on hardware 250c having a third hardware configuration (HC-3), and the simulator process 145d associated with a fourth evaluation program 255d (EP-4) running or executing on hardware 250d having a fourth hardware configuration (HC-4). The different evaluation programs may have different characterization functionality or features, and the different hardware configurations may refer to differences in the system resource settings. As with the simulator processes in FIGS. 2A and 2B, each of these simulator processes can be benchmarked or characterized for different gates and/or quantum operations. The example in FIG. 2C is provided by way of illustration and more or fewer simulator processes than those shown can be supported by the quantum computer simulator system.

Figure 2D:
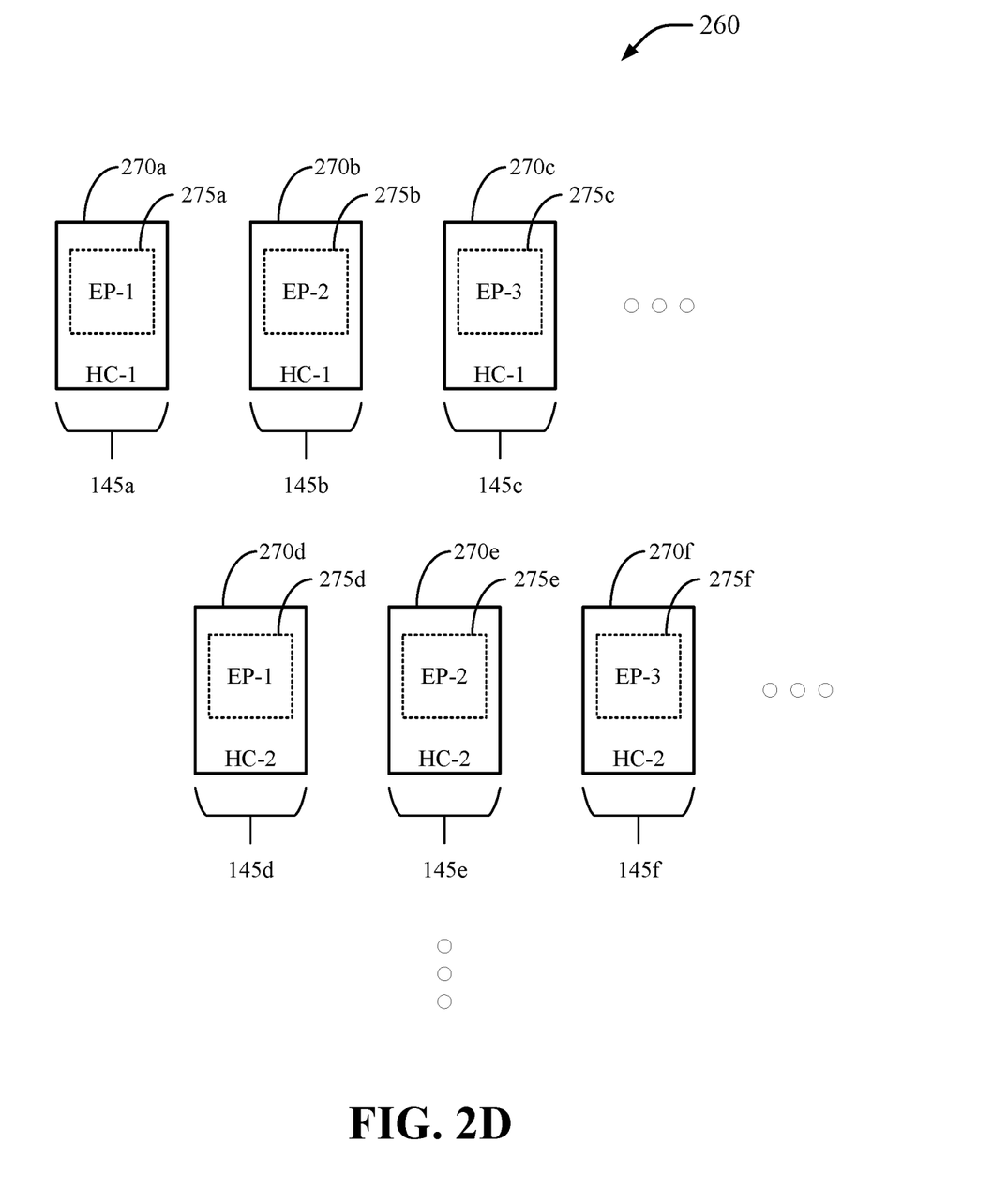

The diagram 260 in FIG. 2D shows yet another example of multiple simulator processes 145a, 145b, 145c, 145d, 145e, 145f . . . , that are available to and supported by a quantum computer simulator system (e.g., quantum computer simulator system 110). In this example, the simulator processes can be represented as multiple sets or groups based on hardware configuration and/or evaluation program. The example shows two sets of simulator processes (although more sets are possible), a first set based on a first hardware configuration (HC-1) that includes at least the simulator process 145a (EP-1 275a and hardware 270a), the simulator process 145b (EP-2 275b and hardware 270b), and the simulator process 145c (EP-3 275c and hardware 270c), and a second set based on a second hardware configuration (HC-2) that includes at least the simulator process 145d (EP-1 275d and hardware 270d), the simulator process 145e (EP-2 275e and hardware 270e), and the simulator process 145f (EP-3 275f and hardware 270f). The different evaluation programs may have different characterization functionality or features, and the different hardware configurations may refer to differences in the system resource settings. As with the simulator processes in FIGS. 2A, 2B, and 2C, each of these simulator processes can be benchmarked or characterized for different gates and/or quantum operations.

The various implementations shown in FIGS. 2A-2D need not be limiting and other combinations of hardware configurations and/or evaluation processes can be used such that a comprehensive hardware/software evaluations matrix is supported.

Figure 3:
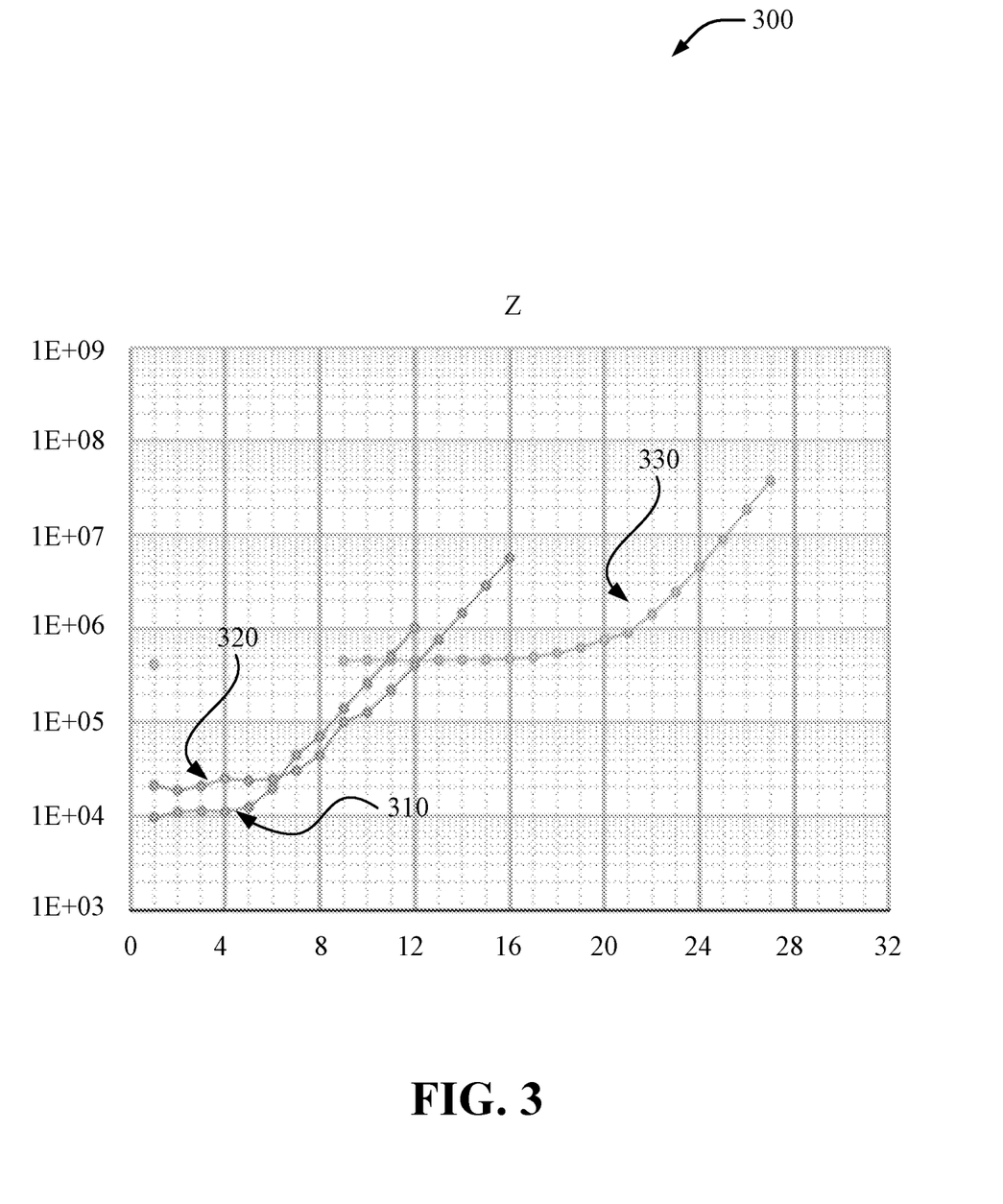
FIG. 3 is a diagram that illustrates examples of a set of characteristic curves in accordance with aspects of this disclosure.

The profile information for each of the different simulator processes 145 that are supported will be different, and the profile information can be captured or represented by different characteristic curves. FIG. 3 shows a diagram 300 that illustrates examples of a set of characteristic curves in accordance with aspects of this disclosure. This figure shows the gate cost (in nanoseconds or ns) for different system qubit counts for uncontrolled Z gates across three different simulation accelerators: single-core CPU-line or characteristic curve 310, multi-core CPU-line or characteristic curve 320, and GPU-line or characteristic curve 330. The connecting lines are provided as a visual aid and the cost for non-integer qubit counts is not meaningful.

In the case of the single-core CPU (e.g., a hardware with hardware configuration having a single-core CPU), at very small numbers of qubits, it is faster than both the multi-core CPU and the GPU. That is, the amount of time it takes to simulate the uncontrolled Z gate in a circuit with a small number of system qubits is less for the single-core CPU. At small number of system qubits the GPU is not an attractive alternative since it takes a lot longer to simulate the uncontrolled Z gate.

The more system qubits that are added, however, the slower the single-core CPU gets (e.g., at around 5 system qubits it begins to slow down), while the GPU becomes attractive. For example, at around 13 system qubits, the GPU is now faster than either of the single-core CPU or the multi-core CPU (note that the line 310 of the single-core CPU would continue to grow exponentially and be higher than the line 330 for the GPU).

The lines or characteristic curves shown in FIG. 3 are simply provided by way of illustration. These types of performance or characteristic curves can be generated by the characterizer 150 for each type of gate or quantum operation, for each number of supported system qubits, for each number of control qubits, and for each type of simulator (e.g., each type of backend hardware accelerator 145). By having such profile information, when the quantum computer simulator system 110 receives a job (e.g., in the queue 125), it is possible to add the cost (e.g., time) for each of the gates, steps, or operations in the job and that will give the total cost of running the job in the single-core CPU, the multi-core CPU, or the GPU, for example. Then the quantum computer simulator system 110 (e.g., via the manager 130) can pick or select whichever backend hardware will be faster (or can provide the time it will take to run the fastest backend hardware), or if there are two or more options that have similar timing performances, whichever one will result in the lower cost of simulation.

Returning to FIG. 3 and line or characteristic curve 310 for the single-core CPU, if the simulations were to be continued beyond 12 system qubits, perhaps all the way to 29 or 30 system qubits, the simulation time for a single gate could be 100 or 1,000 seconds. The single-core CPU hardware would be able to support those simulations and the program running the repeated simulations to obtain the times would not likely run out of memory, but it would take an incredibly long time to complete all the needed simulations to get these results. This is in part because of the need to perform the repeated simulations of the gate to obtain accurate timing information. For example, a gate can be run 400 or more times in a single circuit to reduce the effect of overhead (e.g., initialization, end of program operations) on the timing information. As a result, the characterizer 150 is able to determine when the line or characteristic curve 310 approaches a slope of 2 and makes the decision that from that point on the growth will continue on that path and additional testing is not needed. In one example, when the characterizer 150 detects a trend of four samples for which the slope is 2, then the characterizer 150 can stop increasing the number of system qubits and discontinue that line of testing. It is to be understood that the use of four samples is by way of illustration as more or fewer samples can be used by the characterizer 150 as part of its heuristics to determine when the cut off the testing.

Figure 4:
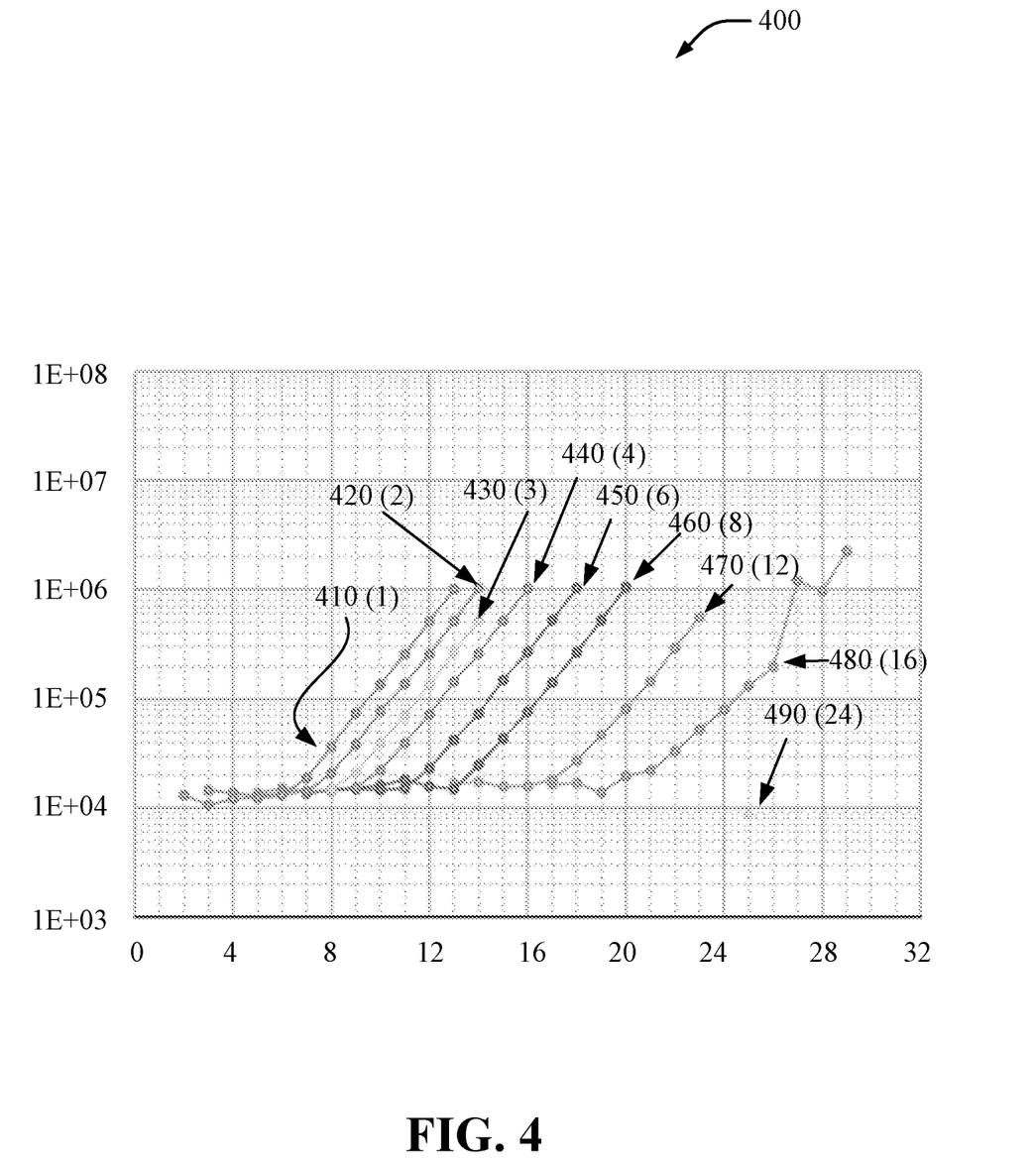
FIG. 4 is a diagram that illustrates examples of another set of characteristic curves in accordance with aspects of this disclosure.

FIG. 4 shows a diagram 400 that illustrates examples of another set of characteristic curves in accordance with aspects of this disclosure. In this case, what is described is the gate cost for different system qubit counts on a single-core CPU for Z gates with selected number of control qubits. Line or characteristic curve 410 is for 1 control qubit, line or characteristic curve 420 is for 2 control qubits, line or characteristic curve 430 is for 3 control qubits, line or characteristic curve 440 is for 4 control qubits, line or characteristic curve 450 is for 6 control qubits, line or characteristic curve 460 is for 8 control qubits, line or characteristic curve 470 is for 12 control qubits, line or characteristic curve 480 is for 16 control qubits, and line or characteristic curve 490 is for 24 control qubits.

Once the profile information is generated by the characterizer 150, the profile information in the characteristic curves can be collected, organized, or otherwise ordered in one or more tables or similar data structures for the quantum computer simulator system 110 to use. One way to look at the operation of the quantum computer simulator system 110 is as a series of queues, with an input queue (e.g., the input queue 125 in the front end 120) and a series of worker queues or worker simulators/nodes (e.g., simulator processes 145 in the backend 140). There is a process by which the contents in the input queue are analyzed (e.g., by the manager 130) in order to select that appropriate worker queue that minimizes the cost of processing the input. Each of the workers associated with the worker queues is self-characterized (e.g., by the characterizer 150), allowing the quantum computer simulator system 110 to dynamically perform this process any time an input is received.

In an aspect of the present disclosure, when the input (e.g., a circuit, quantum program, or quantum algorithm) is received it can be formatted or configured in a high level language (e.g., a high level domain specific quantum programming language). To be simulated or to be analyzed to determine or predict a simulation time, the input can be compiled or converted into a low level language (e.g., a low level domain specific quantum assembly language), which can then be analyzed by, for example, the manager 130, and/or simulated by the appropriate software process 145.

In yet another aspect of the present disclosure, two or more of the software processes 145 can have the same or identical or substantially similar hardware configurations (e.g., the same amount of memory, the same type of CPU or processor) and/or evaluation program. In such instances, the characteristics or profile of one simulator process 145 can apply to another simulator process with the same or identical or substantially similar hardware configuration and/or evaluation program. Thus, when scaling the quantum computer simulator system 110 by adding a new simulator process 145, one step that can be taken is to compare the configuration of the new simulator process 145 to that of existing hardware/software evaluation and if there is existing hardware/software evaluation with the same or identical or substantially similar hardware configuration and/or evaluation program, then all the characterizer 150 and/or the manager 130 needs to do is map or copy the characteristics or profile generated for the existing simulator process 145 to the new simulator process 145 without the need to characterize the new simulator process 145. Adding new simulator processes 145 not only allows for scaling but may also be used to provide redundancies in case one or more of the existing simulator processes 145 need to be taken off line for operational reasons or for maintenance.

Figure 5:
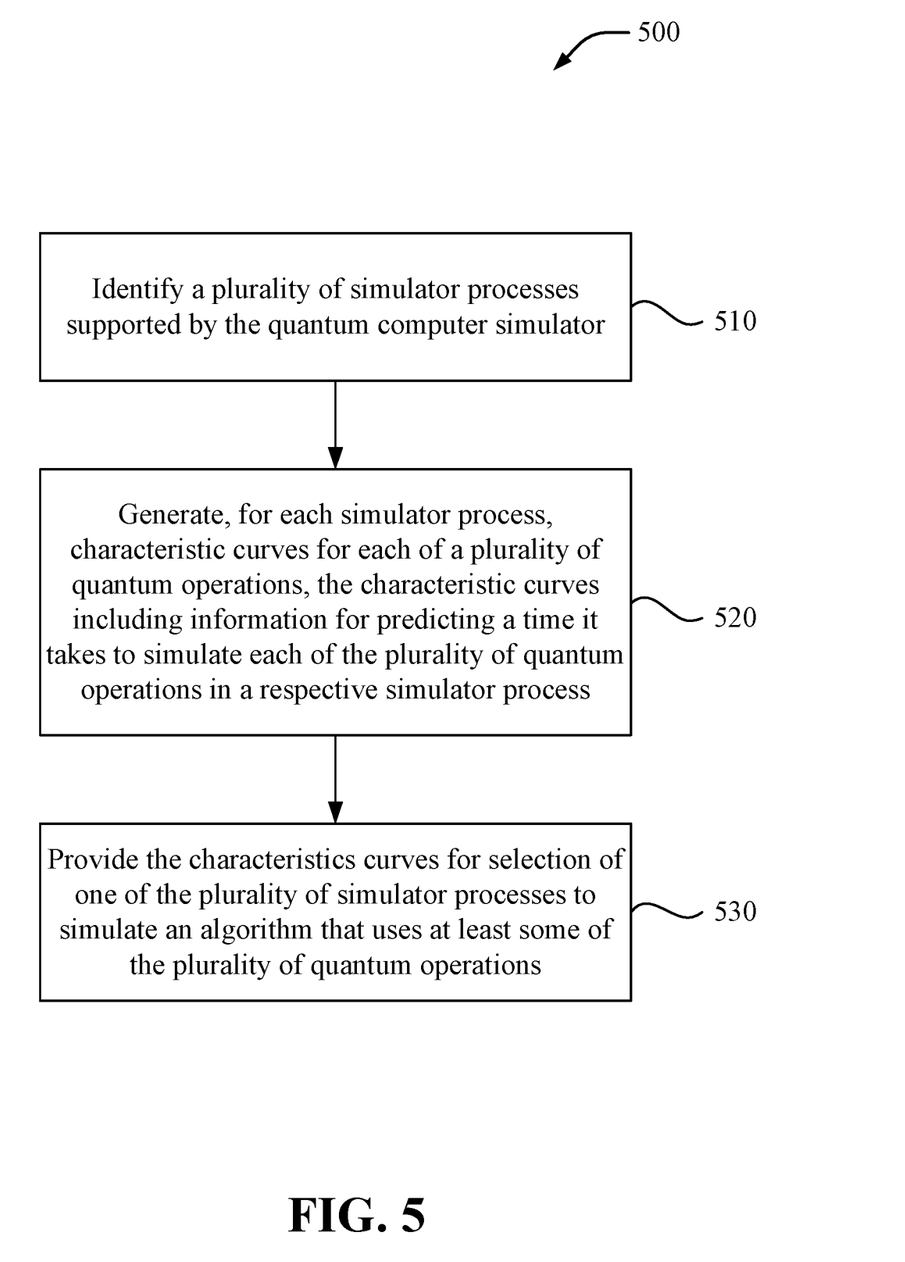
FIG. 5 is a flow chart that illustrates an example of a method for characterizing a quantum computer simulator in accordance with aspects of this disclosure.

FIG. 5 shows a flow chart that illustrates an example of a method 500 for characterizing a quantum computer simulator in accordance with aspects of this disclosure. Aspects of the method 500 may be performed by the quantum computer simulator system 110 in FIG. 1 and/or the computer device 700 in FIG. 7.

At 510, the method 500 includes identifying multiple simulator processes (e.g., simulator processes 145) supported by the quantum computer simulator (e.g., quantum computer simulator system 110).

At 520, the method 500 includes generating, for each simulator process, characteristic curves for each of multiple gates or quantum operations, where the characteristic curves include information for predicting a time it takes to simulate each of the gates or quantum operations in a respective simulator process.

At 530, the method 500 includes providing the characteristic curves for selection of one of the simulator processes to simulate a circuit, quantum program, or quantum algorithm that uses at least some of the gates or quantum operations.

In an aspect of the method 500, each simulator process includes an evaluation program running on separate hardware, the separate hardware having a specified hardware configuration, and the evaluation program being configured to perform a benchmarking functionality to generate the characteristic curves for each of the plurality of gates or quantum operations.

In an aspect of the method 500, the multiple simulator processes include multiple different evaluation programs, each evaluation program running on separate hardware, and each of the separate hardware having a same hardware configuration (see e.g., FIG. 2A).

In an aspect of the method 500, the multiple simulator processes include multiple different evaluation programs, each evaluation program running on separate hardware, and each of the separate hardware having a different hardware configuration (see e.g., FIG. 2C).

In an aspect of the method 500, the multiple simulator processes include multiple hardware, each hardware having a different hardware configuration and running a same evaluation program (see e.g., FIG. 2B).

In another aspect of the method 500, the multiple simulator processes include at least a first group or set of hardware and a second group or set of hardware, each hardware in the first set of hardware having a same first configuration and running a different evaluation program, and each hardware in the second set of hardware having a same second configuration and running a different evaluation program (see e.g., FIG. 2D).

In an aspect of the method 500, each simulator process includes an evaluation program running on separate hardware, the separate hardware being configured to include one or more of a graphic processing unit (GPU), a single-core central processing unit (CPU), a multi-core CPU, a tensor processing unit, an application specific integrated circuit (ASIC), or a field programmable gate array (FPGA)-based Ising model simulator.

In an aspect of the method 500, generating the characteristic curves for each of the gates or quantum operations includes generating the characteristic curves based on one or more of a gate or quantum operation under consideration, a number of control qubits for the gate or quantum operation, or a number of system qubits within a range of system qubits supported by the quantum computer simulator.

In an aspect of the method 500, generating the characteristic curves for each of the gates or quantum operations includes, in an evaluation program of the simulator process, running one of the plurality of gates or quantum operations multiple times to determine an average time it takes to simulate that particular gate or quantum operation in that particular simulator process. The number of repetitions of the gate or quantum operation can be based at least in part on minimizing a contribution, on the average time, of an overhead associated with simulating the circuit, quantum program, or quantum algorithm.

In an aspect of the method 500, generating the characteristic curves for each of the gates or quantum operations includes identifying a trend based on a number of system qubits under consideration, and limiting (e.g., cut off), when the trend is identified, information that is needed to complete the characteristic curves to reduce an amount of time it takes to generate the characteristic curves. In an example, identifying the trend includes identifying that considering an additional system qubit doubles a time to simulate a particular gate or quantum operation. In another example, identifying the trend includes identifying that a simulation of one of multiple gates or quantum operations has similar time cost as a simulation of that particular gate or quantum operation using fewer controls and fewer system qubits.

In an aspect of the method 500, providing the characteristic curves includes organizing information in the characteristic curves into one or more tables (e.g., table(s) 155) accessible by the quantum computer simulator.

In an aspect of the method 500, generating the characteristic curves for each of the gates or quantum operations includes mapping the characteristic curves associated with a first simulator process to a second simulator process having the same, identical, or substantially similar hardware configuration and/or evaluation program as the first simulator process.

Figure 6:
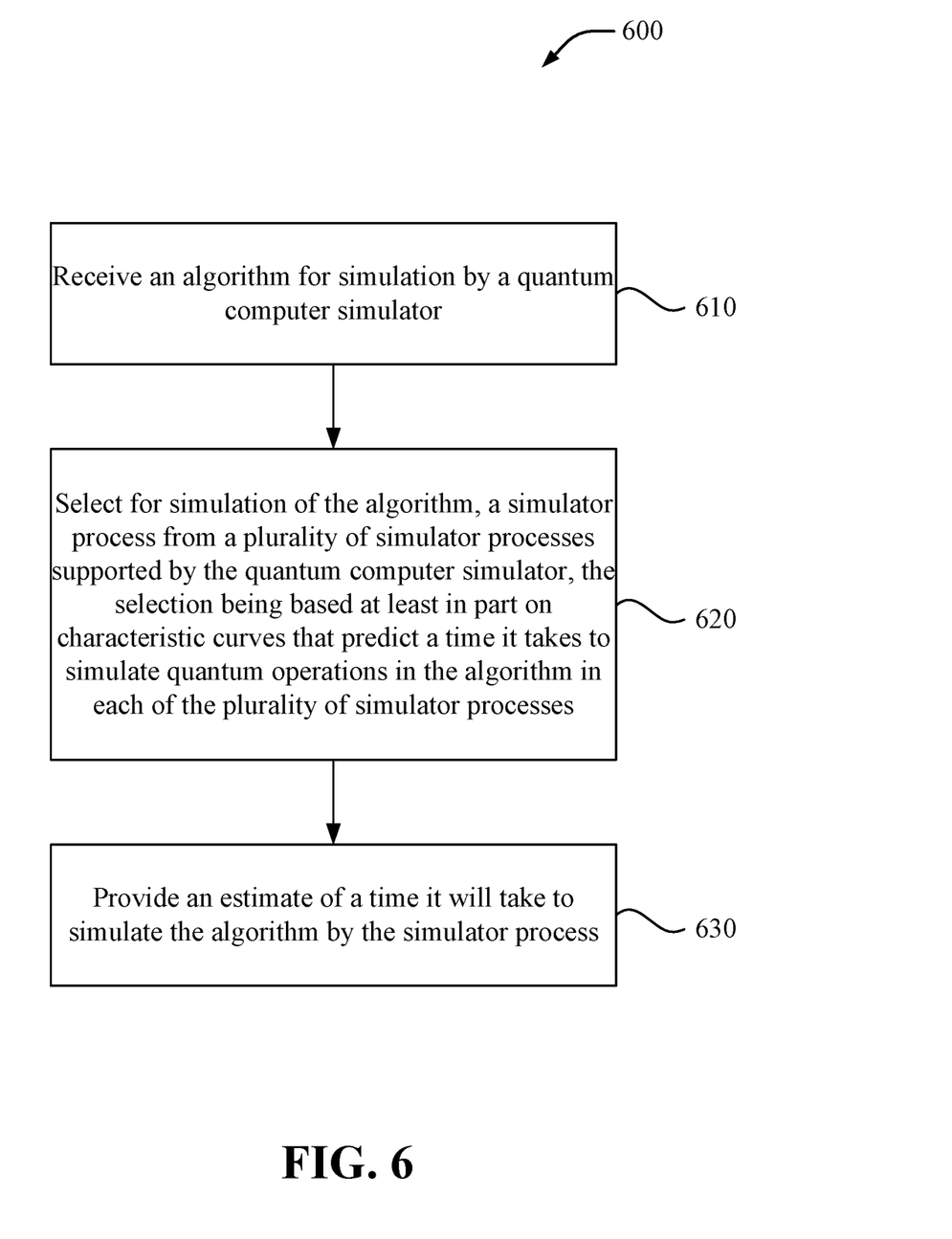
FIG. 6 is a flow chart that illustrates an example of a method for optimizing simulations in a quantum computer simulator in accordance with aspects of this disclosure.

FIG. 6 is a flow chart that illustrates an example of a method 600 for optimizing simulations in a quantum computer simulator in accordance with aspects of this disclosure. Aspects of the method 600 may be performed by the quantum computer simulator system 110 in FIG. 1 and/or the computer device 700 in FIG. 7.

At 610, the method 600 includes receiving a circuit, quantum program, or quantum algorithm (e.g., at the queue 125 in the front end 120) for simulation by the quantum computer simulator (e.g., the quantum computer simulator system 110).

At 620, the method 600 includes selecting (e.g., by the manager 130) for simulation of the circuit, quantum program, or quantum algorithm, a simulator process from multiple simulator processes (e.g., the simulator processes 145) supported by the quantum computer simulator, where the selection is based at least in part on characteristic curves that predict a time it takes to simulate gates or quantum operations in the circuit, quantum program, or quantum algorithm in each of the simulator processes.

At 630, the method 600 includes providing an estimate of the time it will take to simulate the circuit, quantum program, or quantum algorithm by the simulator process.

In an aspect of the method 600, each simulator process includes an evaluation program running on separate hardware, the separate hardware having a specified hardware configuration, and the evaluation program being configured to perform a benchmarking functionality to generate the characteristic curves for each of the plurality of gates or quantum operations.

In an aspect of the method 600, the multiple simulator processes include multiple different evaluation programs, each evaluation program running on separate hardware, and each of the separate hardware having a same hardware configuration (see e.g., FIG. 2A).

In an aspect of the method 600, the multiple simulator processes include multiple different evaluation programs, each evaluation program running on separate hardware, and each of the separate hardware having a different hardware configuration (see e.g., FIG. 2C).

In an aspect of the method 600, the multiple simulator processes include multiple hardware, each hardware having a different hardware configuration and running a same evaluation program (see e.g., FIG. 2B).

In another aspect of the method 600, the multiple simulator processes include at least a first group or set of hardware and a second group or set of hardware, each hardware in the first set of hardware having a same first configuration and running a different evaluation program, and each hardware in the second set of hardware having a same second configuration and running a different evaluation program (see e.g., FIG. 2D).

In an aspect of the method 600, each simulator process includes an evaluation program running on separate hardware, the separate hardware being configured to include one or more of a graphic processing unit (GPU), a single-core central processing unit (CPU), a multi-core CPU, a tensor processing unit, an application specific integrated circuit (ASIC), or a field programmable gate array (FPGA)-based Ising model simulator.

In an aspect of the method 600, the characteristic curves are based at least in part on one or more of a gate or quantum operation under consideration, a number of control qubits for the gate or quantum operation, or a number of system qubits within a range of system qubits supported by the quantum computer simulator.

In an aspect of the method 600, the method 600 further includes converting (e.g., compiling) the quantum algorithm from a high level language to a low level language and providing the low level language to the simulator process for the simulation of the algorithm.

In an aspect of the method 600, two or more of the simulator processes have substantially similar hardware characteristics and/or evaluation program and are represented by a same set of characteristic curves.

In an aspect of the method 600, selecting the simulator process includes accessing one or more tables (e.g., the table(s) 155) including information associated with the characteristic curves.

In an aspect of the method 600, the method 600 further includes simulating the circuit, quantum program, or quantum algorithm by the simulator process.

In an aspect of the method 600, providing the estimate of the time it will take to simulate the circuit, quantum program, or quantum algorithm includes identifying each of the gates or quantum operations in the circuit, quantum program, or quantum algorithm, identifying a time it takes to simulate each of the gates or quantum operations by the simulator process, and estimating or predicting the time it will take to simulate the circuit, quantum program, or quantum algorithm by the simulator process by adding the time it takes the simulator process to simulate each of the gates or quantum operations in the circuit, quantum program, or quantum algorithm.

Figure 7:
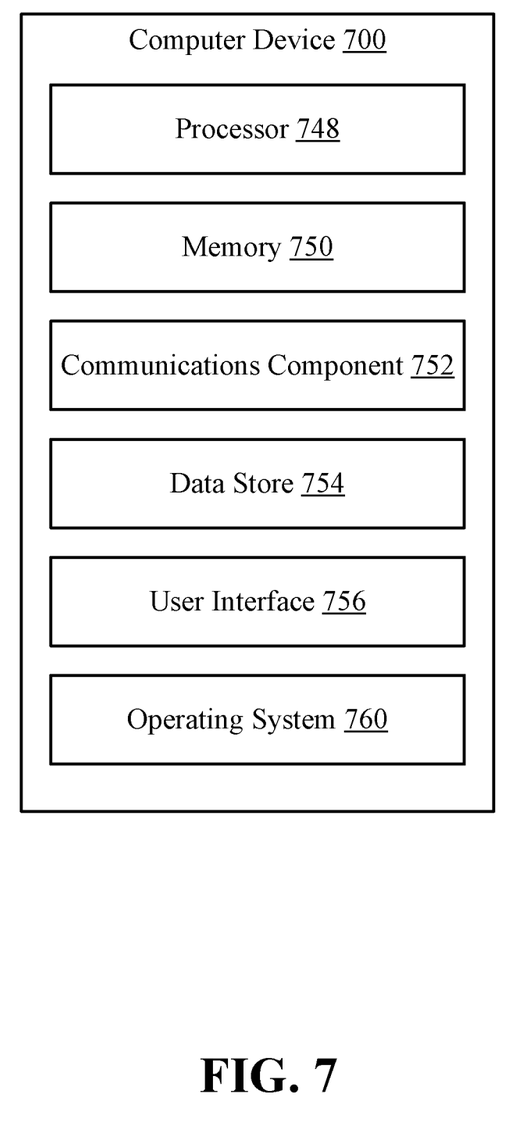
FIG. 7 is a diagram that illustrates an example of a computer device in accordance with aspects of this disclosure.

Referring now to FIG. 7, illustrated is an example computer device 700 in accordance with aspects of the disclosure. The computer device 700 can represent a single computing device, multiple computing devices, or a distributed computing system, for example. The computer device 700 can be configured as a quantum computer, a classical computer, or a combination of quantum and classical computing functions. For example, the computer device 700 can implement some or all of the features described herein for a quantum computer simulators. In some instances, the computer device 700 can be a standalone system that can be used for quantum simulations or can be part of a quantum computing system or a classical computing system capable of performing a wide range of functions, one of which is quantum computer simulations. In other words, the computer device 700 can be used to implement part or all of the quantum computer simulator system 110, including one or more of the simulator processes 145.

In one example, the computer device 700 can include a processor 748 for carrying out processing functions associated with one or more of the features described herein. The processor 748 can include a single or multiple set of processors or multi-core processors. Moreover, the processor 748 can be implemented as an integrated processing system and/or a distributed processing system. The processor 748 can include a CPU, a quantum processing unit (QPU), a GPU, other types of processing architectures, or a combination. In an example, the processor 748 can represent, include, or implement some or all of the simulator processes 145 described in connection with the quantum computer simulator system 110.

In an example, the computer device 700 can include a memory 750 for storing instructions executable by the processor 748 for carrying out the functions described herein. In an implementation, for example, the memory 750 can correspond to a computer-readable storage medium that stores code or instructions to perform one or more of the functions or operations described herein. In one example, the memory 750 can include instructions to perform the methods 500 and 600 in FIGS. 5 and 6, respectively. Moreover, in some examples, the memory 750 can include or represent the table(s) 155 having the profile or characteristic information described herein.

Further, the computer device 700 can include a communications component 752 that provides for establishing and maintaining communications with one or more parties utilizing hardware, software, and services as described herein. The communications component 752 can carry communications between components on the computer device 700, as well as between the computer device 700 and external devices, such as devices located across a communications network and/or devices serially or locally connected to computer device 700. For example, the communications component 752 can include one or more buses, and can further include transmit chain components and receive chain components associated with a transmitter and receiver, respectively, operable for interfacing with external devices.

Additionally, the computer device 700 can include a data store 754, which can be any suitable combination of hardware and/or software, that provides for mass storage of information, databases, and programs employed in connection with implementations described herein. For example, the data store 754 can be a data repository for operating system 60 (e.g., quantum operating system, classical operating system). In one implementation, the data store 754 can include memory 750.

The computer device 700 can also include a user interface component 756 operable to receive inputs from a user of the computer device 700 and further operable to generate outputs for presentation to the user. The user interface component 756 can include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 756 can include one or more output devices, including but not limited to a display, a speaker, a haptic feedback mechanism, a printer, any other mechanism capable of presenting an output to a user, or any combination thereof.

In an implementation, the user interface component 756 can transmit and/or receive messages corresponding to the operation of the operating system 760. In addition, the processor 748 can execute the operating system 760 and/or applications or programs, and the memory 750 or the data store 754 can store them.

When the computer device 700 is implemented as part of a cloud-based infrastructure solution, the user interface component 756 can be used to allow a user of the cloud-based infrastructure solution to remotely interact with the computer device 700.

It is to be understood that the various techniques or features described above can be used to enable a provider of quantum computing services the ability to offer a potential user of these services a guideline as to the capabilities of the system, as well to test and debug quantum code without incurring the cost or complexity of execution on an actual quantum computing system.

Although the present disclosure has been provided in accordance with the implementations shown, one of ordinary skill in the art will readily recognize that there could be variations to the embodiments and those variations would be within the scope of the present disclosure. Accordingly, many modifications can be made by one of ordinary skill in the art without departing from the scope of the appended claims.

What is claimed is:

1. A method for characterizing a quantum computer simulator, comprising
    identifying a plurality of simulator processes supported by the quantum computer simulator;
    generating, for each simulator process, characteristic curves for each of a plurality of gates or quantum operations, the characteristic curves including information for predicting a time it takes to simulate each of the plurality of gates or quantum operations in a respective simulator process; and
    providing the characteristic curves for selection of one of the plurality of simulator processes to simulate a circuit, quantum program, or quantum algorithm that uses at least some of the plurality of gates or quantum operations.

2. The method of claim 1, wherein each simulator process includes an evaluation program running on a separate hardware, the separate hardware having a specified hardware configuration, and the evaluation program being configured to perform a benchmarking functionality to generate the characteristic curves for each of the plurality of gates or quantum operations.

3. The method of claim 1, wherein the plurality of simulator processes include a plurality of different evaluation programs, each evaluation program running on a separate hardware, and each of the separate hardware having a same hardware configuration.

4. The method of claim 1, wherein the plurality of simulator processes includes a plurality of different evaluation programs, each evaluation program running on separate hardware, and each of the separate hardware having a different hardware configuration.

5. The method of claim 1, wherein the plurality of simulator processes includes a plurality of hardware, each hardware having a different hardware configuration and running a same evaluation program.

6. The method of claim 1, wherein the plurality of simulator processes includes at least a first plurality of hardware and a second plurality of hardware, each hardware in the first plurality of hardware having a same first configuration and running a different evaluation program, and each hardware in the second plurality of hardware having a same second configuration and running a different evaluation program.

7. The method of claim 1, wherein each simulator process includes an evaluation program running on a separate hardware, the separate hardware being configured to include one or more of a graphic processing unit (GPU), a single-core central processing unit (CPU), a multi-core CPU, a tensor processing unit (TPU), an application specific integrated circuit (ASIC), or a field programmable gate array (FPGA)-based Ising model simulator.

8. The method of claim 1, wherein generating the characteristic curves for each of the plurality of gates or quantum operations includes generating the characteristic curves based on one or more of the plurality of gates or quantum operations under consideration, a number of control qubits for the gate or quantum operation, or a number of system qubits within a range of system qubits supported by the quantum computer simulator.

9. The method of claim 1, wherein generating the characteristic curves for each of the plurality of gates or quantum operations includes:
    in an evaluation program of the simulator process, running one of the plurality of gates or quantum operations multiple times to determine an average time it takes to simulate that particular gate or quantum operation in that particular simulator process.

10. The method of claim 9, wherein a number of gate or quantum operation repetitions is based at least in part on minimizing a contribution, on the average time, of an overhead associated with simulating the circuit, quantum program, or quantum algorithm.

11. The method of claim 1, wherein generating the characteristic curves for each of the plurality of gates or quantum operations includes:
    identifying a trend based on a number of system qubits under consideration; and
    limiting, when the trend is identified, information that is needed to complete the characteristic curves to reduce an amount of time it takes to generate the characteristic curves.

12. The method of claim 11, wherein identifying the trend includes identifying that considering an additional system qubit doubles a time to simulate a particular gate or quantum operation.

13. The method of claim 11, wherein identifying the trend includes identifying that a simulation of one of the plurality of gates or quantum operations is equivalent to a simulation of that particular gate or quantum operation using fewer controls and fewer system qubits.

14. The method of claim 1, wherein providing the characteristic curves includes organizing information in the characteristic curves into one or more tables accessible by the quantum computer simulator.

15. The method of claim 1, wherein generating the characteristic curves for each of the plurality of gates or quantum operations includes:
    mapping the characteristic curves associated with a first simulator process of the plurality of simulator processes to a second simulator process of the plurality of simulator processes when an evaluation program and a hardware configuration of hardware used for the second simulator process is the same as the evaluation program and the hardware configuration of hardware used for the first simulator process.

16. A method for optimizing simulations in a quantum computer simulator, comprising:
    receiving a circuit, quantum program, or quantum algorithm for simulation by the quantum computer simulator;
    selecting for simulation of the circuit, quantum program, or quantum algorithm, a simulator process from a plurality of simulator processes supported by the quantum computer simulator, the selecting being based at least in part on characteristic curves that predict a time it takes to simulate gates or quantum operations in the circuit, quantum program, or quantum algorithm in each of the plurality of simulator processes; and providing an estimate of the time it will take to simulate the circuit, quantum program, or quantum algorithm by the simulator process.

17. The method of claim 16, wherein each simulator process includes an evaluation program running on a separate hardware, the separate hardware having a specified hardware configuration, and the evaluation program being configured to perform a benchmarking functionality to generate the characteristic curves for each of the gates or quantum operations.

18. The method of claim 16, wherein the plurality of simulator processes include a plurality of different evaluation programs, each evaluation program running on a separate hardware, and each of the separate hardware having a same hardware configuration.

19. The method of claim 16, wherein the plurality of simulator processes include a plurality of different evaluation programs, each evaluation program running on a separate hardware, and each of the separate hardware having a different hardware configuration.

20. The method of claim 16, wherein the plurality of simulator processes includes a plurality of hardware, each hardware having a different hardware configuration and running a same evaluation program.

21. The method of claim 16, wherein the plurality of simulator processes includes at least a first plurality of hardware and a second plurality of hardware, each hardware in the first plurality of hardware having a same first configuration and running a different evaluation program, and each hardware in the second plurality of hardware having a same second configuration and running a different evaluation program.

22. The method of claim 16, wherein each simulator process includes an evaluation program running on a separate hardware, the separate hardware being configured to include one or more of a graphic processing unit (GPU), a single-core central processing unit (CPU), a multi-core CPU, a tensor processing unit, an application specific integrated circuit (ASIC), or a field programmable gate array (FPGA)-based Ising model simulator.

23. The method of claim 16, wherein the characteristic curves are based at least in part on one or more of a gate or quantum operation under consideration, a number of control qubits for the gate or quantum operation, or a number of system qubits within a range of system qubits supported by the quantum computer simulator.

24. The method of claim 16, further comprising:
converting the quantum algorithm from a high level language to a low level language and providing the low level language to the simulator process for the simulation of the circuit.

25. The method of claim 16, wherein two or more of the plurality of simulator processes that have a same evaluation program and hardware configuration of hardware are represented by a same set of characteristic curves.

26. The method of claim 16, wherein selecting the simulator process includes:
accessing one or more tables including information associated with the characteristic curves.

27. The method of claim 16, further comprising simulating the circuit, quantum program, or quantum algorithm by the simulator process.

28. The method of claim 16, wherein providing the estimate of the time it will take to simulate the circuit, quantum program, or quantum algorithm includes:
identifying each of the gates or quantum operations in the circuit, quantum program, or quantum algorithm;
identifying a time it takes to simulate each of the gates or quantum operations by the simulator process; and
estimating a time it will take to simulate the circuit, quantum program, or quantum algorithm by the simulator process by adding the time it takes the simulator process to simulate each of the gates or quantum operations in the circuit, quantum program, or quantum algorithm.

29. A non-transitory computer-readable medium storing code with instructions executable by a processor for compiling source code for characterizing a quantum computer simulator, comprising:
code for identifying a plurality of simulator processes supported by the quantum computer simulator;
code for generating, for each simulator process, characteristic curves for each of a plurality of gates or quantum operations, the characteristic curves including information for predicting a time it takes to simulate each of the plurality of gates or quantum operations in a respective simulator process; and
code for providing the characteristic curves for selection of one of the plurality of simulator processes to simulate a circuit, quantum program, or quantum algorithm that uses at least some of the plurality of gates or quantum operations.

30. A non-transitory computer-readable medium storing code with instructions executable by a processor for compiling source code for optimizing simulations in a quantum computer simulator, comprising:
code for receiving an algorithm for simulation by the quantum computer simulator;
code for translating an algorithm written in a high level language to a low level language representation;
code for selecting, to perform the simulation of a circuit, a simulator process from a plurality of simulator processes supported by the quantum computer simulator, the selection being based at least in part on characteristic curves that predict a time it takes to simulate gates or quantum operations in the circuit in each of the plurality of simulator processes; and
code for providing an estimate of the time it will take to simulate the circuit by the simulator process.

* * * * *